United States Patent
Mandal et al.

(10) Patent No.: US 9,952,500 B2
(45) Date of Patent: Apr. 24, 2018

(54) ADJUSTING OF PATTERNS IN DESIGN LAYOUT FOR OPTICAL PROXIMITY CORRECTION

(71) Applicant: GLOBALFOUNDRIES INC., Grand Cayman (KY)

(72) Inventors: Sudeep Mandal, Bangalore (IN); Arun S. Mampazhy, Bangalore (IN)

(73) Assignee: GLOBALFOUNDRIES INC., Grand Cayman (KY)

( * ) Notice: Subject to any disclaimer, the term of this patent is extended or adjusted under 35 U.S.C. 154(b) by 80 days.

(21) Appl. No.: 15/239,072

(22) Filed: Aug. 17, 2016

(65) Prior Publication Data

US 2018/0052388 A1 Feb. 22, 2018

(51) Int. Cl.
G06F 17/50 (2006.01)
G03F 1/36 (2012.01)

(52) U.S. Cl.
CPC ............ *G03F 1/36* (2013.01); *G06F 17/5081* (2013.01)

(58) Field of Classification Search
CPC ........................................ G03F 1/36
USPC .......................................... 716/53
See application file for complete search history.

(56) References Cited

U.S. PATENT DOCUMENTS

| | | | |
|---|---|---|---|
| 4,520,269 A | 5/1985 | Jones | |
| 5,736,281 A | 4/1998 | Watson | |
| 6,395,438 B1 | 5/2002 | Bruce et al. | |
| 6,753,115 B2 | 6/2004 | Zhang et al. | |
| 7,240,305 B2* | 7/2007 | Lippincott | G03F 1/36 716/52 |
| 7,694,267 B1* | 4/2010 | Ye | G03F 1/144 716/53 |
| 8,321,818 B2 | 11/2012 | Agarwal et al. | |
| 8,832,610 B2 | 9/2014 | Ye et al. | |
| 8,997,027 B2 | 3/2015 | Hamouda et al. | |
| 2006/0177744 A1* | 8/2006 | Bodendorf | G03F 1/36 430/5 |
| 2008/0148218 A1* | 6/2008 | Kawakami | G03F 1/36 716/53 |
| 2010/0153903 A1* | 6/2010 | Inoue | G03F 1/36 716/54 |
| 2010/0175041 A1* | 7/2010 | Krasnoperova | G03F 1/36 716/53 |
| 2010/0205573 A1* | 8/2010 | Busa | G06F 17/5081 716/52 |

* cited by examiner

*Primary Examiner* — Suresh Memula
(74) *Attorney, Agent, or Firm* — Yuanmin Cai; Hoffman Warnick LLC

(57) ABSTRACT

Embodiments of the present disclosure include methods, program products, and systems for adjusting an integrated circuit (IC) layout for optical proximity correction (OPC). Methods according to the disclosure can include: defining a target region of the IC design layout, the target region having a plurality of patterns including a first pattern positioned adjacent to a second pattern, wherein an OPC modeling rule of the IC design layout prohibits the first pattern from being adjusted, and wherein the second pattern does not reduce a printability metric of the first pattern; adjusting the design of the second pattern to reduce at least one printing error in the first pattern, wherein a functionality of the second pattern in the IC design layout is unchanged after the adjusting; and implementing OPC on the IC design layout including the target region with the adjusted second pattern therein.

20 Claims, 9 Drawing Sheets

ADJUSTING OF PATTERNS IN DESIGN LAYOUT FOR OPTICAL PROXIMITY CORRECTION

TECHNICAL FIELD

The present disclosure relates to integrated circuits (ICs). More specifically, the present disclosure relates to methods, program products, and systems for adjusting patterns in an IC design layout for Optical Proximity Correction (OPC).

BACKGROUND

As IC components have continued to decrease in size, improvements to scale have spawned design implementation issues for some types of features, e.g., in CMOS ICs with features sized less than approximately twenty-two nanometers (nm). As IC technology continues to shrink, the growing need for empirical data from a design may exacerbate the uncertainty of the manufacturing process, thereby increasing the risk of defects or impaired operability. Conventional approaches for traversing physical limits may apply manual or computer-implemented techniques for increasing the resolution of chips printed using optical lithography. One such technique is known as optical proximity correction (OPC). OPC is a computational method for correcting irregularities and distortions arising from diffraction effects by the transforming of mask geometries.

Conventional OPC approaches can use empirical approximation models to predict the effect of imaging errors on the printing of an IC due to manufacturing constraints, diffraction effects, etc. Such models can receive an input in the form of multiple patterns each representative of an ideally printed feature. Using this input, a model can be generated to show expanded and corrected formats of the patterns, known as shapes, which account for possible manufacturing and printing errors. The OPC model can then be used as a basis for printing the product. An OPC model can therefore include one or more feature shapes which may have an associated "printability metric," a measurement for determining how each pattern affects the ability to fabricate the IC from the design layout. Two example printability metrics can include: Lithographic Difficulty Estimators (LDE) and the critical dimension. An "LDE," as used herein, can refer to a multiplying coefficient calculated for a particular group of patterns, which represents process-related factors which can decrease the printability metric of each pattern in a given region. The LDE can be directly proportional to the critical dimension for two features in a region. A "critical dimension" refers to the smallest distance between two features of a particular region, below which the features cannot be reliably printed to a wafer or mask. Regions with lower value LDEs and/or higher critical dimensions relative to others generally reflect a higher level of printability.

Conventional techniques may address one or more concerns relative to technology scaling and the ever-decreasing separation distance between features in an IC layout. Traditional OPC adjustment mechanisms may include, e.g., modifying a selected feature which may be difficult to print due to the physical proximity and associated effects of one or more neighboring features in a region of printed feature patterns within the IC layout. In some cases, a particular feature may cause or contribute to an unusually low printability metric for one or more of its neighboring features in an IC layout. Such effects on the printability metric of individual features in a design layout have become more pronounced with further reductions in feature size. Techniques for reconfiguring or resizing features in an IC layout will continue to affect the quality of a product as the size of each feature, and the separation distance between neighboring features, in an IC layout continues to decrease.

SUMMARY

A first aspect of the present disclosure provides a computer-implemented method for adjusting an integrated circuit (IC) design layout for optical proximity correction (OPC), the method including using a computing device to perform actions including: defining a target region of the IC design layout, the target region having a plurality of patterns including a first pattern positioned adjacent to a second pattern, wherein an OPC modeling rule of the IC design layout prohibits the first pattern from being adjusted, and wherein the second pattern does not reduce a printability metric of the first pattern; adjusting the design of the second pattern to reduce at least one printing error in the first pattern, wherein a functionality of the second pattern in the IC design layout is unchanged after the adjusting; and implementing OPC on the IC design layout including the target region with the adjusted second pattern therein.

A second aspect of the present disclosure provides a program product stored on a computer readable storage medium, the program product operative to adjust an integrated circuit (IC) layout for optical proximity correction (OPC) when executed, the computer readable storage medium including program code for: defining a target region of the IC design layout, the target region having a plurality of patterns including a first pattern positioned adjacent to a second pattern, wherein an OPC modeling rule of the IC design layout prohibits the first pattern from being adjusted, and wherein the second pattern does not reduce a printability metric of the first pattern; adjusting the design of the second pattern to reduce at least one printing error in the first pattern, wherein a functionality of the second pattern in the IC design layout is unchanged after the adjusting; and implementing OPC on the IC design layout including the target region with the adjusted second pattern therein.

A third aspect of the present disclosure provides a system for adjusting an integrated circuit (IC) layout for optical proximity correction (OPC), the system including: a computing device configured to define a target region of the IC design layout, the target region having a plurality of patterns including: a first pattern positioned adjacent to a second pattern, wherein an OPC modeling rule of the IC design layout prohibits the first pattern from being adjusted, and wherein the second pattern does not reduce a printability metric of the first pattern; and an OPC modeling device for adjusting the design of the second pattern in an OPC model to reduce printing errors in the first pattern, wherein a functionality of the second pattern in the IC design layout is unchanged after the adjusting, and wherein the OPC model is used to manufacture at least one IC.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which.

Figure 1:
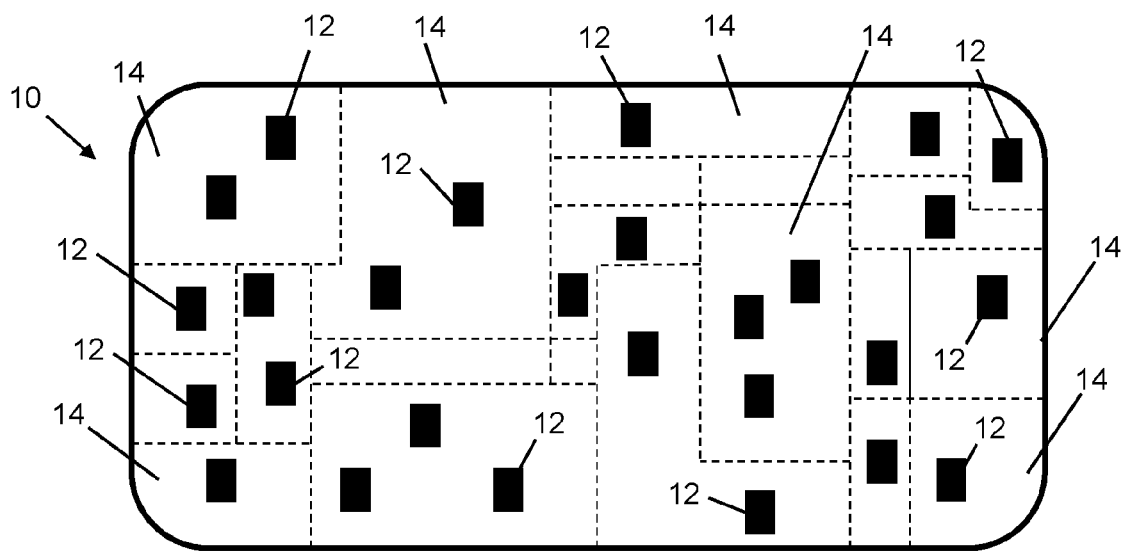
FIG. 1 provides a schematic view of a design layout with multiple patterns and regions to be targeted and/or processed in embodiments of the present disclosure.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific exemplary embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

Introduction and General Definitions

Embodiments of the present invention are directed toward techniques for adjusting an integrated circuit (IC) design layout (also identified herein as a "design layout") for optical proximity correction (OPC). Embodiments of the present disclosure provide for defining one or more target regions of the IC design layout, each of which can include a set of individual patterns therein. The target region can include a first pattern, also known as a "victim pattern," which may exhibit a reduced or impaired printability metric due to one or more other design aspects of the IC design layout and/or other patterns included therein. One or more constraints, e.g., an OPC modeling rule of the IC design layout, may initially prohibit the first pattern from being adjusted (e.g., resized and/or redesigned to include a different shape or different shapes) without substantial changes to the entire design layout. Thus, correcting errors in the first pattern by direct adjustment may not be feasible.

The target region can also include a second pattern positioned adjacent to the first pattern, and may be designed such that the printability metric of the first pattern is not reduced by a design of the second pattern. Embodiments of the present disclosure can include adjusting a design of the second pattern to reduce printing errors in the first pattern, but without changing any functionality of the second pattern in the design layout. Thereafter, the method can include implementing OPC on the IC design layout including the target region and the adjusted second pattern such that the manufactured IC layout offers increased printability and exhibits fewer printing errors. In some scenarios, the first pattern may also be positioned adjacent to a third pattern in the target region, also known as an "aggressor pattern." Various physical attributes of the third pattern (e.g., size and immediate proximity) may cause the third pattern to increase the number or degree of printing errors in the first pattern when the target region of the IC layout is printed. Various design constraints may prohibit adjustment of the third pattern. Embodiments of the present disclosure can offer improvement to the printability of first patterns affected by third (i.e., aggressor) patterns by adjusting the second pattern, without affecting the design or printability of the third patterns.

To better illustrate the various embodiments of the present disclosure, particular terminology which may be known or unknown to those of ordinary skill in the art is defined to further clarify the embodiments set forth herein. The term "system" can refer to a computer system, server, etc. composed wholly or partially of hardware and/or software components, one or more instances of a system embodied in software and accessible a local or remote user, all or part of one or more systems in a cloud computing environment, one or more physical and/or virtual machines accessed via the internet, other types of physical or virtual computing devices, and/or components thereof. The term "IC layout" can refer to a complete or partial IC chip which includes multiple circuit features ("features"). A "feature" generally refers to a functional element in an IC layout (e.g., a wire) which must be printed on a wafer using photolithography techniques. An "IC design layout" or simply "design layout" refers to a virtual representation of an IC layout or portion thereof, which may be stored, e.g., in a memory component of a computer system. A "region" refers to any subset of a given design layout. A "pattern" or "feature pattern" refers to a design layout representation of one or more features in an IC layout, which may be transferred from the memory of a computer system onto a mask by way of direct-write electron beam lithography. Optical proximity correction (or "OPC") generally refers to a process by which an IC layout is modeled for printing by converting a set of ideal feature patterns into corrected feature shapes to account for one or more printing errors. "Printability" generally refers to how each feature shape affects a user's ability to fabricate the IC layout as a whole, and can be quantified in terms of a printability metric. A "shape" or "feature shape" refers to an estimated printing region of a given pattern in an OPC model, which may account for printing errors or related constraints.

A "first pattern" or "victim pattern" in a design layout corresponds to a feature which experiences a printing distortion or reduced printability metric due to attributes of the IC layout in general, and/or one or more proximity effects of its adjacent shapes. A "second pattern" or "neutral pattern" in a design layout refers to a feature pattern positioned adjacent to the first pattern, and which does not reduce (e.g., negatively affect) a printability metric of the first pattern. Defined alternatively, the second pattern could be removed from the IC layout without reducing the printability metric of the respective first pattern. However, embodiments of the present disclosure include modifying the design of one or more second patterns to improve the printability metric of a corresponding first pattern, as described in detail herein. A "third pattern" or "aggressor pattern" in a design layout corresponds to a feature placed directly adjacent to the first pattern, and thus reduces or otherwise distorts the printability of the first pattern. In general, removing the third pattern or increasing the separation distance between the first and third patterns can increase a printability metric for the region and first pattern, but this option may not be available due to design constraints for the IC layout and/or OPC model.

Example of Target Region and Pattern Modification

FIG. 1 provides a diagram illustrating a design layout 10 indicative of an integrated circuit (IC) product to be modeled and manufactured using optical proximity correction (OPC). Design layout 10 may include patterns 12 to illustrate the position of various features to be printed. Patterns 12 can be grouped together into portions of the IC layout, and each portion can be known as a region 14. Each region 14 may include patterns 12 which are in close physical proximity relative to other patterns, and/or may be functionally interrelated or designed to be manufactured together. In FIG. 1, each region 14 is shown to be of a different size by way of example only. It is understood that each region 14 in design layout 10 may be of the same size and shape (i.e., each shape corresponding to pattern(s) 12 may be rectangular). The size and shape of region(s) 14 can also differ from one design layout 10 to another, e.g., one design layout 10 can have regions 14 with a uniform size, while another design layout 10 can have regions 14 with a non-uniform size. In some cases, design layout 10 may include only a select group of regions 14 and patterns 12, which may provide a group of empirical data for OPC.

Printing each pattern 12 in regions 14 of design layout 10 can present trade-offs and related technical challenges. In practice, design layout 10 may include, e.g., thousands of regions 14 which together may represent millions of distinct patterns 12. Manually adjusting every pattern 12 in design layout 10 for improved printability may be prohibitively time consuming and expensive and may cause OPC to become excessively difficult for some design layouts 10. However, not adjusting certain patterns 12 to overcome printing errors or constraints may impair the operability of an IC product and/or limit the usefulness of OPC. Inventive aspects of the present disclosure relate to the processes by which some regions 14 and their corresponding patterns 12 are adjusted to improve the usefulness of design layout 10 for OPC and eventual manufacture. Specifically, aspects of the present disclosure can define one or more regions 14 as "target regions" for adjustment of patterns 12 therein. Each region 14 targeted for adjustment can include a group of patterns 12 including a first pattern which has an impaired printability metric, e.g., as result of inherent design attributes and/or being positioned adjacent to a third pattern as described elsewhere herein. In any case, various constraints may prevent the first pattern from being directly adjusted (e.g., moved, removed, resized, etc.). A second may be positioned directly adjacent to the first pattern, and the second pattern may not reduce (e.g., negatively affect) the printability metric of the first pattern. Embodiments of the present disclosure can include identifying such second patterns and modifying their design to improve the printability of the first pattern without modifying the shape and position of the first pattern and/or any third patterns in region 14. Embodiments of the present disclosure can be applicable for regions in which directly adjusting the first and second patterns would violate predetermined design rules, and/or other situations not discussed.

Figure 2:
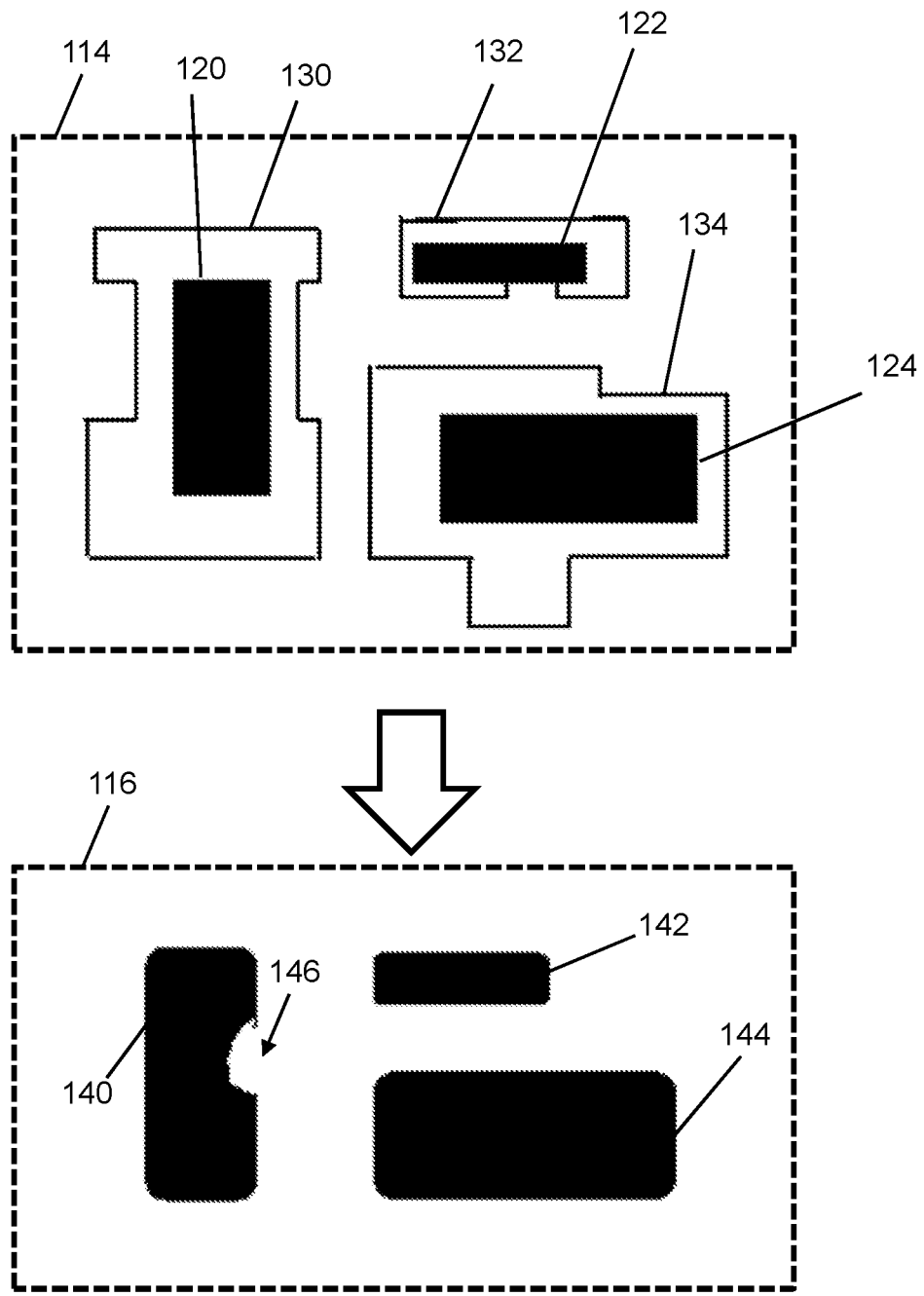
FIG. 2 provides a schematic view of a group of patterns and printed features in an IC design layout before being processed in embodiments of the present disclosure.

Turning to FIG. 2, an example of a target region 114 in design layout 10 and a corresponding printed region 116 is shown according to embodiments of the present disclosure. Target region 114 can include a first pattern 120 (also known as a "victim pattern"), a second pattern 122 (also known as an "neutral pattern") positioned adjacent to first pattern 120, and a third pattern 124 (also known as a "aggressor pattern") positioned adjacent to first and second patterns 120, 122. In an OPC model, each pattern 120, 122, 124 may have a corresponding first shape 130, second shape 132, and third shape 134. When design layout 10 with target region 114 is used to print an IC product, printed region 116 corresponding with target region 114 can include a first feature 140 corresponding to first pattern and shape 120, 130, a second feature 142 corresponding to second pattern and shape 122, 132, and a third feature 144 corresponding to third pattern and shape 124, 134.

Target and printed regions 114, 116 illustrate a technical challenge which may be associated with implementing OPC on design layout 10 (FIG. 1). In general, first pattern 120 may have a reduced printability metric relative to a desired printability metric for target region 114. In some cases, the size, proximity, and/or other features of third pattern 124, may impair the printability metric of first pattern 120, e.g., as may be illustrated by the proximity of first shape 130 to third shape 134. Due to first and third patterns 120, 124 corresponding to significant patterns 12 (FIG. 1) in design layout 10, design rules and/or constraints may prevent first and third patterns 120, 124 from being modified directly before an associated IC product is printed on a wafer. If such concerns are disregarded before printing (e.g., no substantial adjustment or redesign of target region 114 is attempted), printed region 116 may include first feature 140 with a void 146 therein stemming from the reduced printability metric of first pattern 120 in target region 114. In some cases, void 146 in first feature 140 may be associated with one or more operational impairments in a resulting IC product, e.g., resistances, capacitances, voltage drops, etc., outside a desired tolerance window or manufacturing safety requirement for the product. Rather than attempting to resolve such issues by redesigning first and third patterns 120, 124 in target region 114, embodiments of the present disclosure instead provide initially for adjustments of second pattern 122. Second pattern 122 may correspond to one or more elements in an IC product which may be adjusted (e.g., moved, removed, resized, etc.) without violating one or more rules or design constraints of design layout 10. In an example embodiment, second pattern 122 can represent a non-functional feature of a device produced from design layout 10, e.g., a dummy structure such as a non-functional wire or via in an IC. Examples of a dummy structure represented by second pattern 122 can include, e.g., a metal fill formed between or within other circuit elements. Second pattern 122 can alternatively represent other types of features in an IC product, e.g., functional features which are either related to or independent from operational functions of the IC. In an alternative example, second pattern 122 can represent, e.g., a functional pattern such as a connecting wire or via between two circuit elements whose shape may be altered without changing its own functionality.

Figure 3:
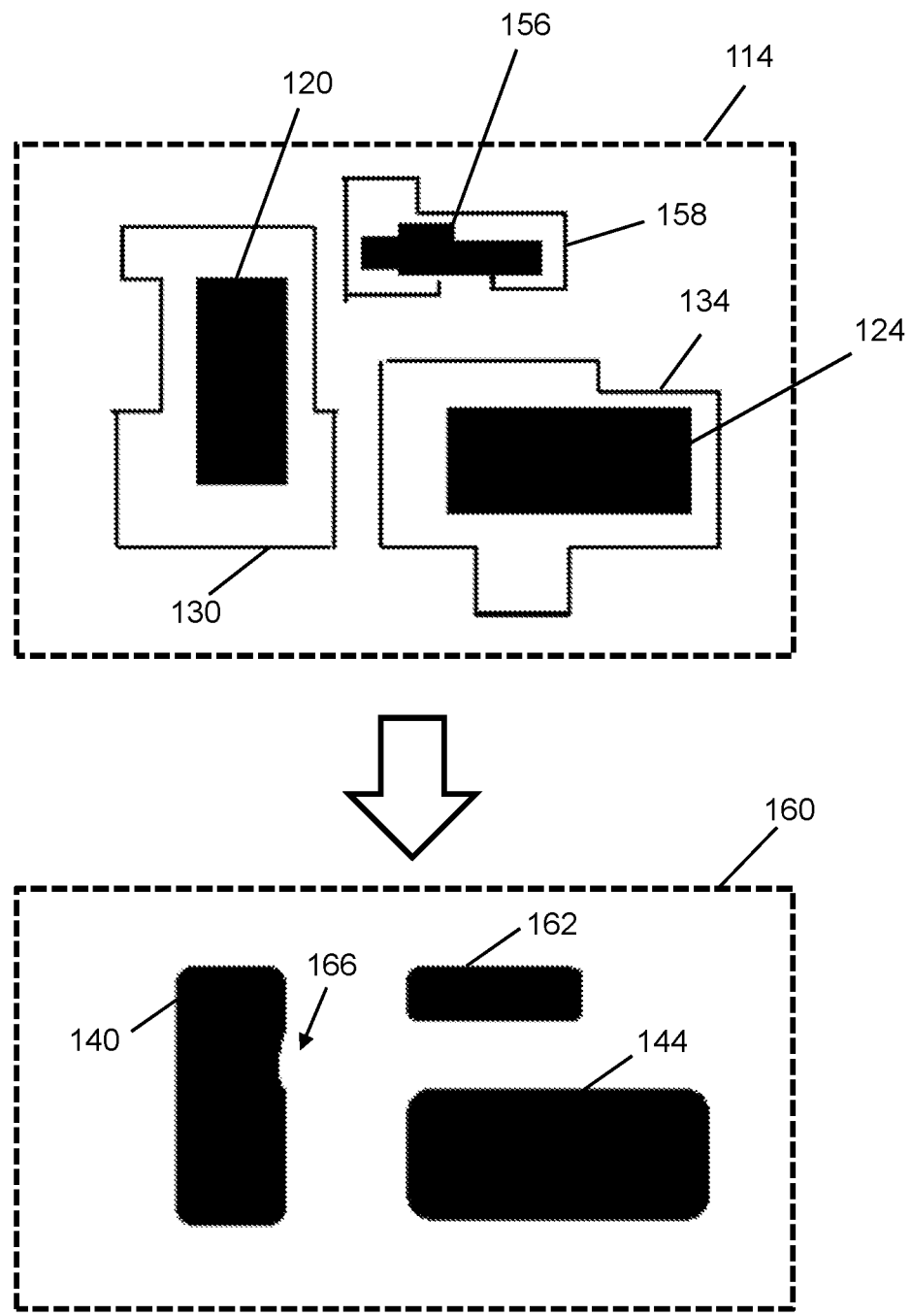
FIG. 3 provides a schematic view of a group of patterns and printed features in an IC design layout after being processed in embodiments of the present disclosure.

Turning to FIG. 3, embodiments of the present disclosure can include processes for adjusting second pattern 122 (FIG. 2) and second shape 132 (FIG. 2) to improve the printability metric of first pattern 120 and thereby reduce the size of any void 146 (FIG. 2). Target region 114 can be defined to include second pattern 122 which does not reduce the printability metric of first pattern 120 in its original state. To improve the printability metric of first pattern 120 without adjusting first and/or third patterns 120, 124, embodiments of the present disclosure can include adjusting the design of second pattern 122 and second shape 132 to create an adjusted second pattern 156. The adjusting of second pattern 122 can include, e.g., increasing the size, shape, position, etc., of second pattern 122 relative to first pattern 120 and/or third pattern 124.

A user (e.g., by way of an OPC modeling device) can implement OPC on design layout 10 (FIG. 1) or a portion thereof (e.g., only target region 114) with adjusted second pattern 156 to yield an adjusted second shape 158. Adjusted second shape 158 can increase the printability metric of first pattern 120 and thus the total printability of target region 114. Including second pattern and shape 156, 158 in target region 114 of design layout 10 (FIG. 1) can thus improve the printability metric of first pattern 120 or, in some cases, eliminate the proximity effects of third pattern 124 on first pattern 120. An adjusted printed region 160 yielded from including adjusted second pattern and shape 156, 158 can include an adjusted second feature 162 which may be different in shape, size, position, etc., relative to second feature 142 (FIG. 2). Despite first feature 140 being printed from the same first pattern 120 and first shape 130, first feature 140 can exhibit greater printability metric and thus include a reduced void 166 as a result of adjusted third pattern 156 being included in target region 114. It is also understood that void 164 (FIG. 2) may be eliminated entirely in some embodiments, e.g., by including adjusted second pattern 156 and adjusted second shape 158 in target region 114. In any event, implementing adjusted second pattern 156 in an OPC model can increase the total printability of target region 114 reduce or eliminate voids 164 in first feature 140 without requiring any adjustment to first and/or patterns 120, 124.

Computer System and Example Components

Figure 4:
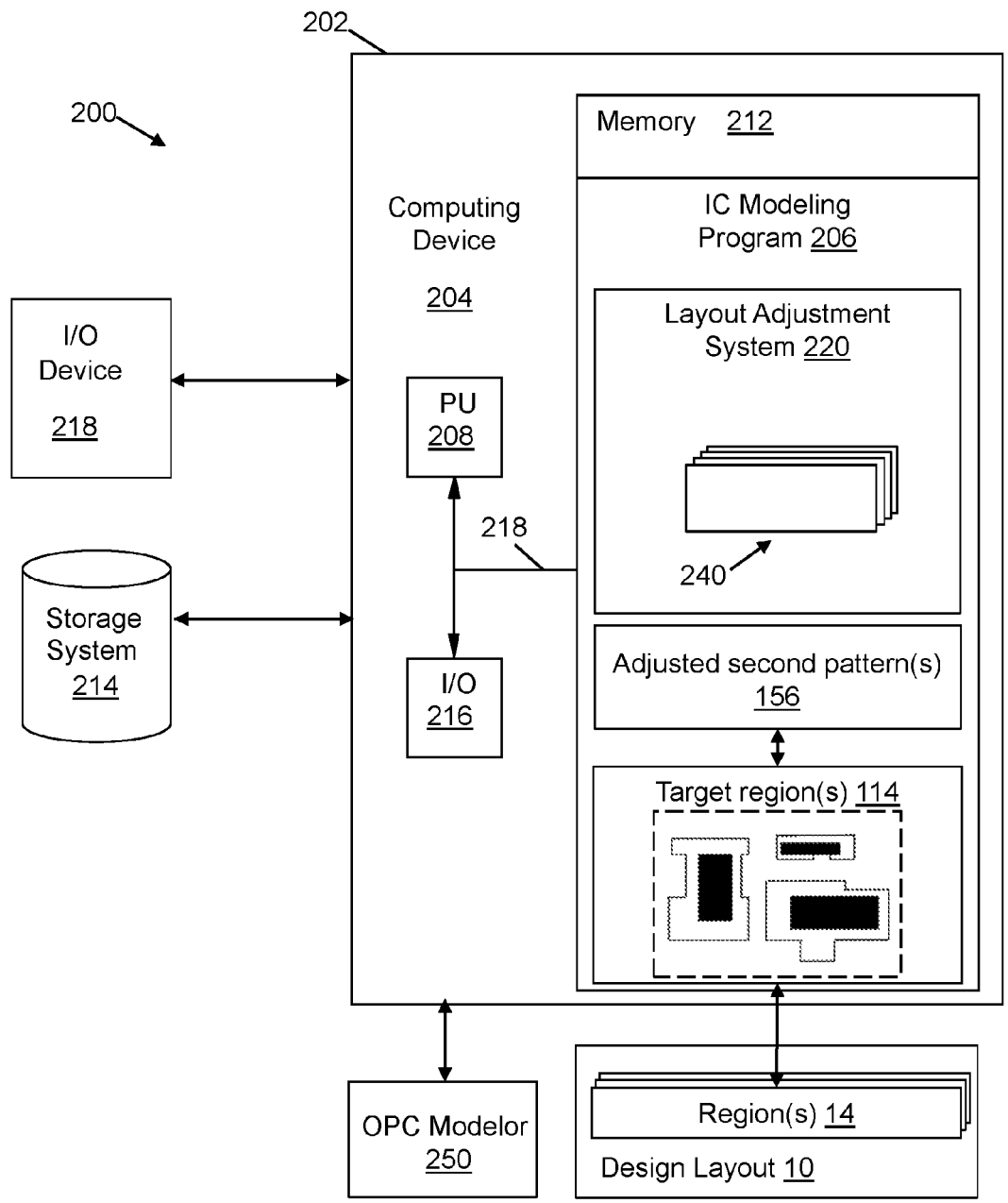
FIG. 4 depicts an illustrative environment which includes a computer system interacting with an IC design layout according to embodiments of the present disclosure.

Turning now to FIG. 4, an illustrative environment 200 for implementing the methods and/or systems described herein is shown. In particular, a computer system 202 is shown as including a computing device 204. Computing device 204 can include an IC modeling program 206 which adjusts patterns in a design layout by performing any/all of the processes described herein and implementing any/all of the embodiments described herein.

Computer system 202 is shown including a processing unit 208 (e.g., one or more processors), an I/O component 210, a memory 212 (e.g., a storage hierarchy), an external storage system 214, an input/output (I/O) device 216 (e.g., one or more I/O interfaces and/or devices), and a communications pathway 218. In general, processing unit 208 can execute program code, such as IC modeling program 206, which is at least partially fixed in memory 212. While executing program code, processing unit 208 can process data, which can result in reading and/or writing data from/to memory 212 and/or I/O device 216. Pathway 218 provides a communications link between each of the components in environment 200. I/O component 210 can comprise one or more human I/O devices, which enable a human user to interact with computer system 202 and/or one or more communications devices to enable a system user to communicate with the computer system 202 using any type of communications link. To this extent, IC modeling program 206 can manage a set of interfaces (e.g., graphical user interface(s), application program interface(s), etc.) that enable system users to interact with IC modeling program 206. Further, IC modeling program 206 can manage (e.g., store, retrieve, create, manipulate, organize, present, etc.) data, through several modules 240 contained within a layout adjustment system 220.

Further, IC modeling program 206 can include layout adjustment system 220. In this case, various modules of layout adjustment system 220 can enable computer system 202 to perform a set of tasks used by IC modeling program 206, and can be separately developed and/or implemented apart from other portions of IC modeling program 206. IC modeling program 206 can model one or more target region(s) 114 representative of region(s) 14 in design layout 10. As discussed elsewhere herein, design layout 10 can be divided into a plurality of regions 14. One of the plurality of regions 14 in design layout 10 can be defined (e.g., selected, extracted, etc.) as a target region 114. Target region(s) 114 may be selected for adjustment in embodiments of the present disclosure in accordance with any desired criterion or group of criteria for identifying target region(s) 114. For example, each target region 114 can include first, second, and/or third patterns 120, 122, 124 (FIG. 2) with associated properties as noted elsewhere herein. Optionally, each defined target region(s) 114 can exhibit at least one projected printing error metrics which exceeds a threshold value. As is generally known in the art, a "printing error" or "projected printing error" of a particular region may be expressed in terms of, e.g., a spacing error (i.e., likelihood that two adjacent features are printed too close together or too far apart), a width error (i.e., likelihood that one feature is printed with a width or other spatial dimension which is larger or smaller than anticipated), and/or a coverage error (i.e., likelihood of variance between the expected surface area of a feature and the surface area of a printed feature). In an example embodiment, each target feature 114 can include a projected printing error, e.g., above approximately five percent for one or more of printing error sources. Process steps for adjusting second pattern(s) 122 in target region(s) 114 are discussed in further detail elsewhere herein.

Memory 212 can include various software modules 240 configured to perform different actions. Example modules can include, e.g., a comparator, a calculator, a determinator, etc. One or more modules 240 can use algorithm-based calculations, look up tables, software code, and/or similar tools stored in memory 212 for processing, analyzing, and operating on data to perform their respective functions. Each module discussed herein can obtain and/or operate on data from exterior components, units, systems, etc., or from memory 212 of computing device 204. Layout adjustment system 220 of IC modeling program 206 can assist in adjusting various portions of design layout 10 according to embodiments discussed herein. Plurality of regions 14 may represent distinct portions of design layout 10. One or more regions 14 can be selected as target region(s) 114 to be processed according to the criteria described herein and/or other techniques. Some attributes of target region(s) 114 can be converted into a data representation (e.g., a data matrix with several values corresponding to particular attributes) and stored electronically, e.g., within memory 212 of computing device 204, storage system 214, and/or any other type of data cache in communication with computing device 204. As discussed elsewhere herein, each target region 114 can be removed temporarily or from design layout 10 (e.g., by being flagged, marked-off, etc.), or replaced after being adjusted, after being used in embodiments of the present disclosure. Target region(s) 114 can additionally or alternatively be converted into data inputs or other inputs to IC modeling program 206 with various scanning or extracting devices and/or manual entry of a user, e.g., by determining the dimensions of region(s) 14, measuring and/or determining topology measures (e.g., a polygon count, area density, and/or diffraction order coefficient), calculating a value of a printability metric based on the attributes of each pattern in region(s) 14, etc.

Computer system 202 can be operatively connected to or otherwise in communication with an OPC modeling device ("OPC modelor") 250. OPC modelor 250 can generate OPC models using, e.g., IC modeling program 206. OPC models generated with OPC modelor 250, and which include adjusted or unadjusted region(s) 14 therein, can be transmitted to a fabricating device or system to manufacture ICs. OPC modelor 250 can be one of several devices in a semiconductor manufacturing plant, or can be multiple devices each operatively connected to computer system 202. Embodiments of the present disclosure can include adjusting design layout 10, generating an OPC model using, e.g., modules 240 of IC modeling program 206, before using OPC modelor 250 to generate an OPC model.

Where computer system 202 comprises multiple computing devices, each computing device may have only a portion of IC modeling program 206 and/or layout adjustment system 220 fixed thereon (e.g., one or more modules). However, it is understood that computer system 202 and layout adjustment program 206 are only representative of various possible equivalent computer systems that may perform a process described herein. Computer system 202 can obtain or provide data, such as data stored in memory 212 or storage system 214, using any solution. For example, computer system 202 can generate and/or be used to generate data from one or more data stores, receive data from another system, send data to another system, etc.

Operational Methodology

Figure 5:
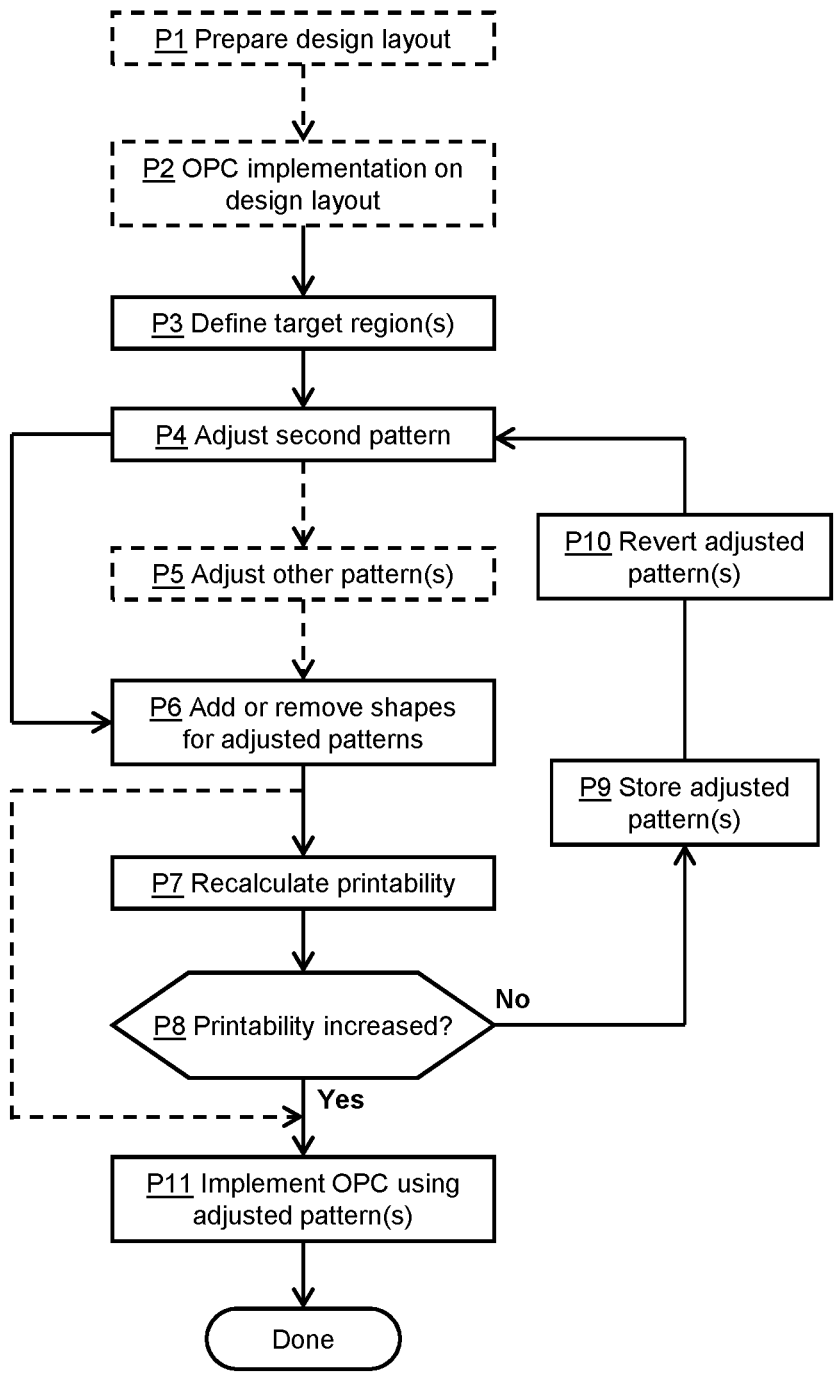
FIG. 5 depicts a flow diagram with illustrative process steps according to embodiments of the present disclosure.

Referring to FIG. 5 in conjunction with FIG. 4, an illustrative flow diagram of processes according to the present disclosure is shown. The process flow diagram of FIG. 5 provides an overview of various method steps and processes. The steps and processes can each be carried out with one or more modules 240 of layout adjustment system 220 and described herein by example. Embodiments of the present disclosure, as illustrated by example in FIG. 5, can adjust target region(s) 114 in design layout 10 according to process steps discussed herein. Using the process steps discussed herein, layout adjustment system 220 can adjust patterns in each target region 114 to improve the printability metric of target region(s) 114 and, more generally, design layout 10. In the example method steps discussed herein, target region 114 will generally be described as including at least three patterns therein, with some alternative examples referring to target regions 114 with more than three patterns (e.g., four patterns, ten patterns, etc.). It is also understood that the present disclosure can be implemented with respect to multiple target regions 114 simultaneously and/or sequentially, with each target region 114 including patterns 12 (FIG. 1) with any conceivable dimensions, in any conceivable number, etc., and that other examples are discussed herein where appropriate.

In process P1, design layout 10 can be prepared for an IC product to be manufactured. Modules 240 of layout adjustment system 220 can prepare design layout 10 directly, e.g., by executing software for converting a set of specifications into design layout 10 for manufacturing an IC, or OPC modelor 250 may provide a pre-configured form of design layout 10 to IC modeling program 206 as a preliminary step. In any event, design layout 10 can be stored directly within computer system 202 (e.g., within memory 212 and/or storage system 214) or can be accessed by computer system 202. As noted herein, design layout 10 can include multiple regions 14 each with corresponding patterns 12 indicative of several IC elements and/or sub-structures, referred to generally as features. Regions 14 in design layout 10 can be determined, e.g., by a manual or automatic division of design layout 10 into regions 14. As discussed elsewhere herein, each region 14 can be of uniform or non-uniform size or shape. Design layout 10 itself can represent all of a single IC product and/or a distinct portion of a larger IC product. In any event, the processing of target region(s) 114 according to embodiments of the present disclosure automatic based on predetermined criteria defined by IC modeling program 206 (e.g., receiving design layout 10 from an independent system, software program, etc.), can be dictated via user selection, and/or can be selected via rules generated by a system and/or programmed by a user. In any case, one or more of the plurality of regions 14 in design layout 10 of process P1 can be eligible for processing as target region(s) 114, e.g., by including first, second, and (optionally) third patterns 120, 122, 124 (FIGS. 2, 3) as described herein.

In process P2, OPC modelor 250 and/or modules 240 in IC modeling program 206 can implement OPC on the entirety of design layout 10. Process P2 can be implemented before adjusting any patterns 12 (FIG. 1) in any region 14, e.g., to predict where one or more types of printing errors may occur without further adjustment of target region(s) 114. Implementing OPC on design layout 10 in process P2, among other things, can serve as a preliminary step to defining target region(s) 114 by providing an estimated printability metric for each pattern 12 and region 14 in design layout 10. Implementing OPC on design layout 10 can also predict, e.g., where further adjustment of patterns 12 in design layout 10 is not desirable (e.g., by an estimated likelihood of printing errors being below a corresponding threshold). Processes P1 and P2 of the illustrative flow diagram may represent preliminary processes executed before and/or independently from the other processes described herein, and thus are shown in phantom in the process flow of FIG. 5.

Process P3 in embodiments of the present disclosure can include defining one or more target regions 114 in design layout 10. Each target region 114 can include at least two patterns therein, including first pattern 120 (also known as a victim pattern), second pattern 122 (also known as a neutral pattern). In some cases, target region(s) 114 can include third pattern 124 (also known as an aggressor pattern). Modules 240 of layout adjustment system 220 may define target regions 114 in design layout 10 solely based on whether a given region 14 includes patterns 120, 122, 124 with the various properties described elsewhere herein. Modules 240 can optionally further define target regions 114 from regions 14 with first, second, and/or third patterns 120, 122, 124 based on whether any patterns therein exhibit a significant likelihood of printing errors. For example, each target region 114 defined in process P3 can include one or more projected printing error metrics (e.g., spacing error, width error, coverage error, etc.) above at least approximately five percent.

At process P4, modules 240 of layout adjustment system 220 can adjust second pattern 122 (FIG. 2) in each target region 114 to yield adjusted second pattern 156 (FIG. 3). The adjusting of second pattern 122 can include, e.g., changing the size, outline, orientation, etc., of second pattern 122 such that second pattern 122 exhibits different proximity effects on first pattern 120 relative to its original configuration. In the case of adjusting second pattern 122 relative to third pattern 124, such adjustments may reduce, overcome, neutralize, etc., any proximity effects of third pattern 124 on first pattern 120. An example adjustment of second pattern 122 to yield adjusted second pattern 156 is shown in FIGS. 2-3 and described in detail elsewhere herein. Adjusted second pattern 156 can thus counteract the proximity effects of third pattern 124 to improve the printability metric of first pattern 120, e.g., by reducing the LDE or increasing the critical dimension in design layout 10.

Figure 6:
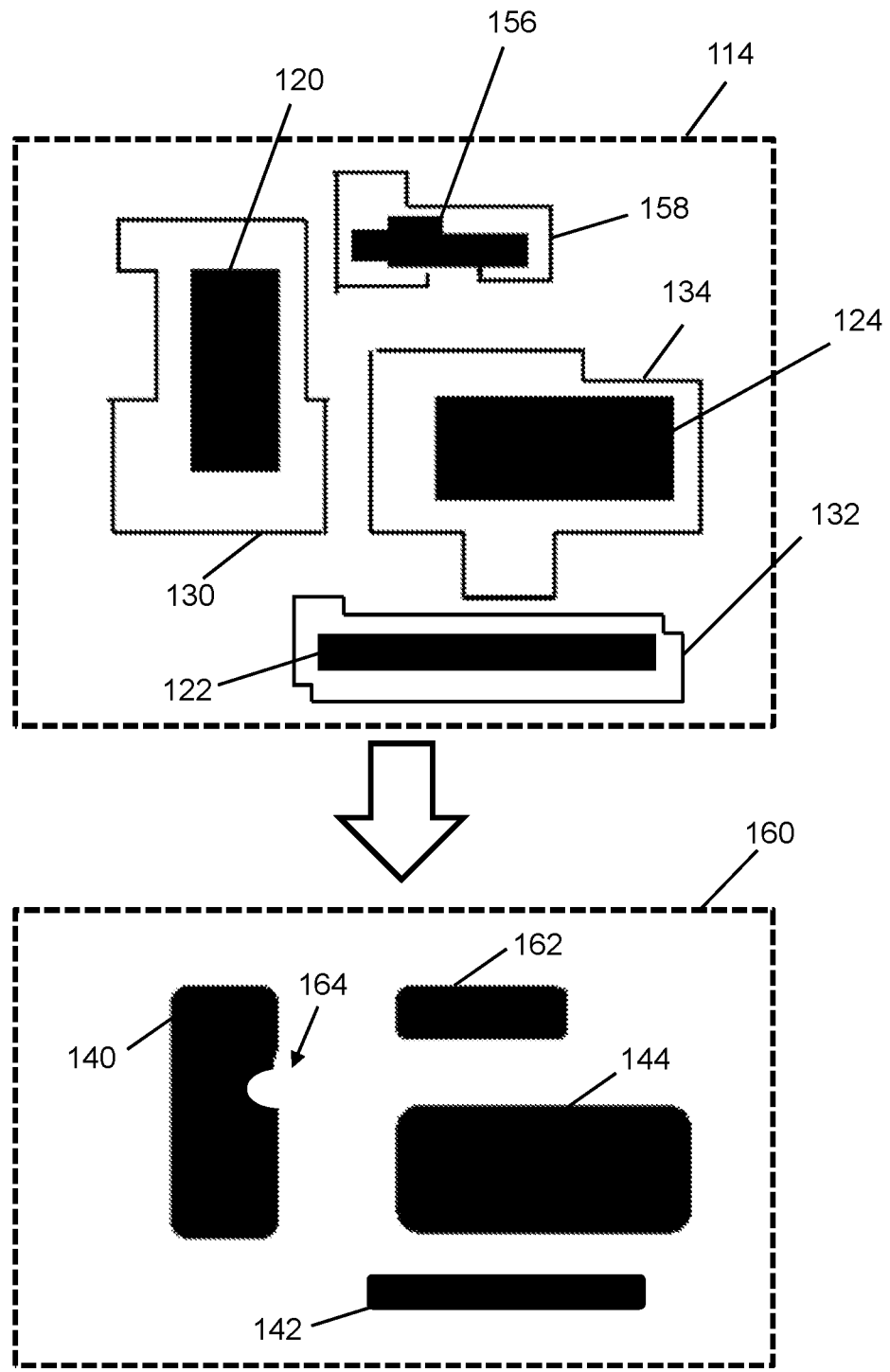
FIG. 6 depicts a schematic view of a group of adjusted and unadjusted patterns and features in an IC design layout after being processed in embodiments of the present disclosure.
Figure 7:
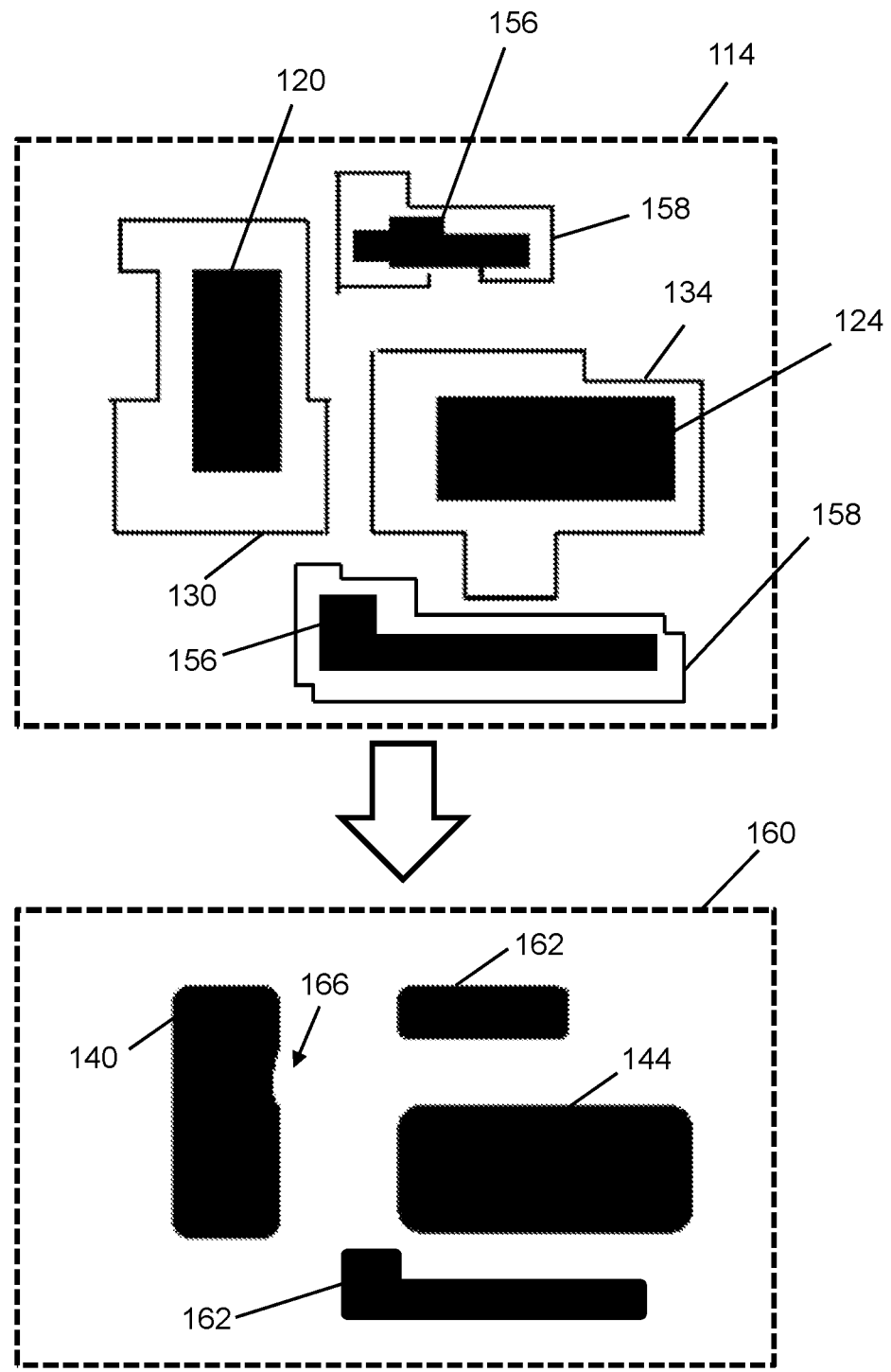
FIG. 7 depicts a schematic view of a group multiple adjusted patterns and features in an IC design layout after being processed in embodiments of the present disclosure.

Referring to FIGS. 4-7 together, embodiments of the present disclosure can optionally include additional processes for target regions 114 which include additional second patterns 122, i.e., additional patterns which do not reduce the printability metric of first pattern 120 in their initial state. As shown in FIG. 6, target region 114 may include at least one other second pattern 122 which retains its original design even after adjusted second pattern 156 is produced. In an example scenario, void 164 may remain within first feature 140 in adjusted printed region 160, even with adjusted second pattern 156 in target region 114. To further increase the printability metric of first feature 140 and/or reduce the occurrence of voids 164, embodiments of the present disclosure can optionally include adjusting other patterns in process P5 (shown in phantom). More specifically, other patterns which fit the criteria of second pattern 122 (described elsewhere herein) can be modified to further improve the printability metric of first pattern 120 and/or counteract any proximity effects of third pattern 124 on first pattern 120. As shown in FIG. 7, additional second patterns 124 can be modified to form additional adjusted second patterns 156 to further increase the printability metric of first pattern 120. In some cases, void(s) 164 in first feature 140 may become reduced voids 166 and/or eliminated entirely after second pattern(s) 122 are adjusted. In other embodiments, other patterns besides second pattern(s) 122 in target region 114 may be adjusted in process P5 to improve the printability metric of one or more first patterns 120, in the same manner as depicted in FIGS. 2-3 and 6-7 and/or other techniques (e.g., direct manipulation of design layout 10). In some cases, first pattern 120 may become adjustable as a result of second pattern(s) 122 being adjusted, despite design constraints and/or other rules preventing initial adjustment of first pattern 120. Here, first pattern 120 itself may be adjusted (e.g., resized, reoriented, etc.) to further reduce the size and/or presence of voids 164 in first feature 140.

In any event, the flow can proceed to process P6 of adding and/or removing shapes in the adjusted patterns. As noted elsewhere herein, each pattern 120, 122, 124 of design layout 10 can have a respective shape 130, 132, 134 indicative of predicted printing errors during manufacture. Adjusting second pattern 122 in process P4 and/or other patterns in process P5 can cause a corresponding adjustment of first, second, and third shapes 130, 132, 134. That is, adjusting only one pattern of design layout 10 (i.e., second pattern 122 without adjusting first or third patterns 120, 124) may nonetheless cause associated changes in shapes 130, 132, 134 due to the effect of each pattern on the printability metric of other patterns. As shown in FIG. 3, adjusted second pattern 156 can be associated with an adjusted second shape 158 which reflects an adjusted printing prediction for second feature 162. To create adjusted second shape 158, modules 240 of layout adjustment system 220 can add shapes to second pattern 122 and/or remove shapes from second pattern 122. As indicated by the accompanying phantom process flow, methods according to the present disclosure can include implementing OPC on design layout 10 (e.g., in process P10, described elsewhere herein) after layout adjustment system 220 creates adjusted second patterns and shapes 156, 158 in target region 114. In other embodiments, the flow can proceed to one or more additional processes described herein.

Process P7 in embodiments of the present disclosure can include recalculating the printability metric of target region 114 which include adjusted second pattern(s) 156 in addition to first and/or third patterns 120, 124. The recalculating in process P7 can be implemented, e.g., by using modules 220 of layout adjustment system 220 and/or OPC modelor 250 to produce a localized model of target region 114 to determine one or more printability metrics (e.g., LDE and/or critical dimension, as described elsewhere herein). The adjusted printability metrics for target region 114 after the adjusting may have a different value from the original printability metrics for target region 114. At process P8, modules 240 of layout adjustment system 220 can compare the printability of target region 114 with adjusted pattern(s) (e.g., adjusted second pattern(s) 156) therein to determine whether the adjustment in process P4 (and, optionally, process P5) increases the printability metric of target region 114. In the event that the printability metric decreases or remains the same (i.e., "No" at process P8), the flow can proceed to process P9 of storing the adjusted pattern(s) for possible later or alternative use (e.g., in memory 212 or storage system 214 of computer system 202). Thereafter, modules 240 of layout adjustment system 220 can restore the adjusted patterns to their original form in step S10 and reimplement the adjusting of patterns in process P4 (and, optionally, process P5) but with different adjustments. Processes P4-P10 can thus be implemented in a looping fashion until the printability metric of target region 114 increases.

Where the adjustments of process P4 (and, optionally, process P5) increases the printability metric of target region 114, the adjusted target region 114 can be incorporated into design layout 10 and submitted for OPC execution. When printability of target region 114 increases after second pattern 122 is adjusted to create adjusted second pattern 156 (i.e., "Yes" at process P8) can cause the flow to proceed to implementing OPC on design layout 10 (e.g., with modules 240 of layout adjustment system 220 and/or OPC modelor 250) using the adjusted patterns. Implementing OPC on adjusted design layout(s) 10 in process P11 can provide increased an printability metric for design layout 10 as a whole. Such increases in printability can yield reduced voids 166 (FIGS. 3, 7) and/or a lack of voids in first feature 140, and possibly other features (e.g., third feature 144, adjusted second feature 162).

Example for Layouts without Third Pattern(s)

Figure 8:
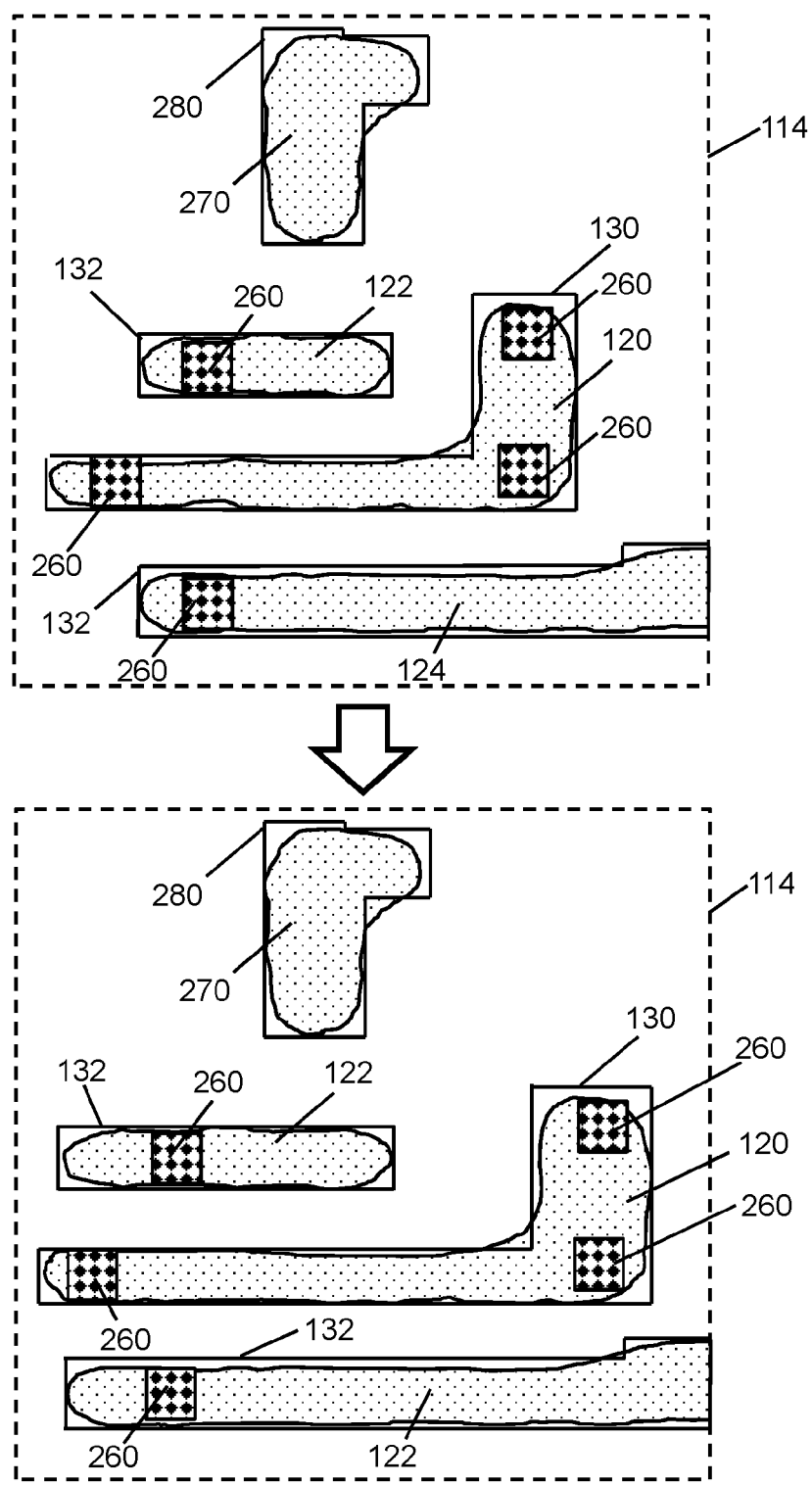
FIG. 8 depicts a schematic view of adjusted and unadjusted features in an IC design layout, in which aggressor patterns are absent from a target region.

Referring to FIGS. 4, 5, and 8 together, embodiments of the present disclosure can be implemented for target region(s) 114 without third pattern(s) 124 (FIGS. 2-3, 6-7), third shape(s) 134 (FIGS. 2-3, 6-7), and/or associated third feature(s) 144 (FIGS. 2-3, 6-7) as described elsewhere herein. Target region 114 may include first pattern 120 and first shape 130 positioned adjacent to two or more second patterns 122 and third shapes 132, e.g., laterally between second patterns and shapes 122, 132 as depicted in FIG. 8. Each pattern 120, 122 may intersect with one or more vias 260 providing an electrical connection between two vertically separated portions of an IC layout. In addition to patterns 120, 122 and shapes 130, 132, target region 114 may include one or more additional patterns 270 and additional shapes 280 with negligible effects on the printability of first pattern 120.

Although third pattern(s) 124 (FIGS. 2-3, 6-7) and third shape(s) 134 (FIGS. 2-3, 6-7) may be absent from target region 114, embodiments of the present disclosure can be implemented for first pattern(s) 120 positioned adjacent to one or more second pattern(s) 122. FIG. 8 depicts target region 114 before and after adjustment of second pattern(s) 122 according to embodiments of the present disclosure. After target region 114 is defined (e.g., in process P3), modules 240 of layout adjustment system 220 can adjust one or more second patterns 122 to improve the printability metric of first pattern 120, e.g., by increasing the length of one or more second patterns 122 as depicted in FIG. 8. These adjustments to second patterns 122 can improve the printability metric of first pattern 120, e.g., by resizing first pattern 120 to cover a larger area and/or provide additional space where vias 260 can be formed on first pattern 120. Following the adjustments to first and second patterns 120, 122, first and second shapes 130, 132 can be adjusted in process P6 as described elsewhere herein, before the printability of target region 114 is recalculated in process P7 as also described elsewhere herein. Embodiments of the present disclosure can thus be implemented to improve a printability metric of target region(s) 114 which lack third pattern(s) 124 but include first pattern(s) 120, second pattern(s) 122, and additional pattern(s) 270.

Example for Removal of Second Pattern(s)

Figure 9:
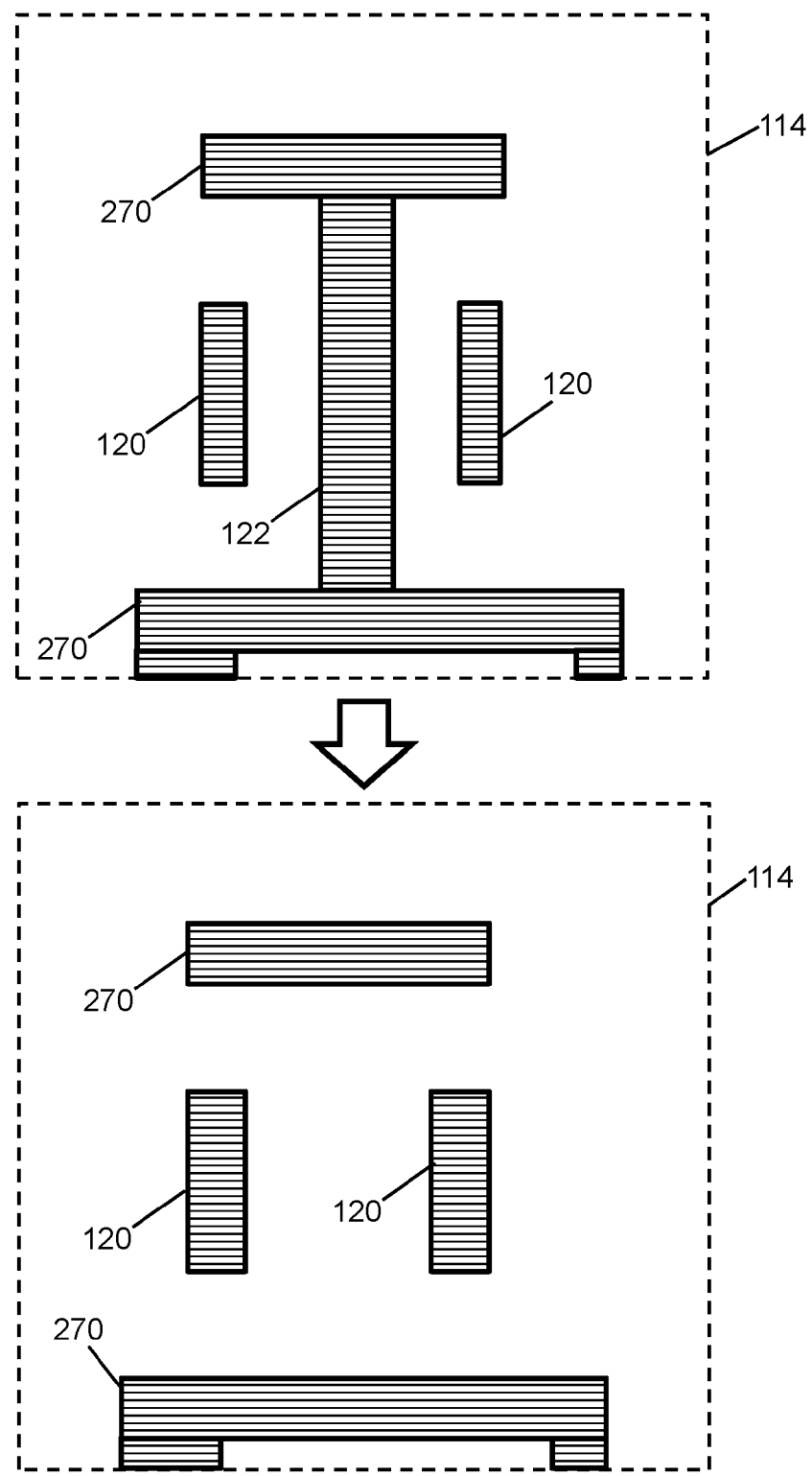
FIG. 9 depicts a schematic view of an initial IC design layout and an adjusted version of the IC design layout in which at least one feature pattern has been removed.

Adjustment of second pattern(s) Referring to FIGS. 4, 5, and 9 together, embodiments of the present disclosure can be implemented on target region(s) 114 by removing second pattern(s) 122 from target region(s) 114, as an alternative or additional process for adjusting second pattern(s) 122 in process P4 as described elsewhere herein. In the example of FIG. 9, second pattern 122 may be positioned directly laterally between two first patterns 120. Corresponding shapes 130 (FIGS. 2-3, 6-8), 132 (FIGS. 2-3, 6-8), 280 (FIG. 8) and vias 260 (FIG. 8) are omitted from patterns 120, 122, 270 in FIG. 9 solely for the purposes of clarity. First patterns 120 may have a distorted printability within target region 114, e.g., by being projected to print within a narrower surface area than may be desired. Second pattern 122 may extend laterally between additional patterns 270, but may represent, e.g., a non-functional or dummy portion of the IC design in target region 114.

Although second pattern 122 may not directly reduce the printability metric of first patterns 120, modules 240 of layout adjustment system 220 can target second pattern 122 for adjustment or removal in process P4. As illustrated in FIG. 9, layout adjustment system 220 may remove second pattern 122 from target region 114, while leaving additional patterns 270 intact. Removing second pattern 122 from target region 114 can first patterns 120 to be printable across a wider cross-sectional area, despite second pattern 122 not previously reducing the calculated printability metric of first patterns 120. Following the removal of second pattern(s) 122 as a form of adjustment in process P4, the flow can proceed to adjusting other pattern(s) in target region 114 in process P5, adding or removing shapes from the various patterns in process P6, recalculating printability in process P7, etc. Thus, embodiments of the present disclosure can include removing one or more second patterns 122 entirely from target region(s) 114, e.g., with modules 240 of layout adjustment system 220, in addition to or instead of adjusting the design of second pattern(s) 122 as described elsewhere herein.

Alternative Embodiments and Implementations

As will be appreciated by one skilled in the art, the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module," or "system." Furthermore, aspects of the present invention may take the form of a computer program product embodied in one or more computer readable medium(s) having computer readable program code embodied thereon.

Any combination of one or more computer readable medium(s) may be used. A computer readable storage medium may be, for example, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing. Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described above with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks. The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

As used herein, the term "configured," "configured to" and/or "configured for" can refer to specific-purpose features of the component so described. For example, a system or device configured to perform a function can include a computer system or computing device programmed or otherwise modified to perform that specific function. In other cases, program code stored on a computer-readable medium (e.g., storage medium), can be configured to cause at least one computing device to perform functions when that program code is executed on that computing device. In these cases, the arrangement of the program code triggers specific functions in the computing device upon execution. In other examples, a device configured to interact with and/or act upon other components can be specifically shaped and/or designed to effectively interact with and/or act upon those components. In some such circumstances, the device is configured to interact with another component because at least a portion of its shape complements at least a portion of the shape of that other component. In some circumstances, at least a portion of the device is sized to interact with at least a portion of that other component. The physical relationship (e.g., complementary, size-coincident, etc.) between the device and the other component can aid in performing a function, for example, displacement of one or more of the device or other component, engagement of one or more of the device or other component, etc.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A computer-implemented method for adjusting an integrated circuit (IC) design layout for optical proximity correction (OPC), the method comprising using a computing device to perform actions including:
   defining a target region of the IC design layout, the target region having a plurality of patterns including a first pattern positioned adjacent to a second pattern, wherein an OPC modeling rule of the IC design layout prohibits the first pattern from being adjusted, and wherein the second pattern does not reduce a printability metric of the first pattern;
   adjusting the design of the second pattern to reduce at least one printing error in the first pattern, wherein a functionality of the second pattern in the IC design layout is unchanged after the adjusting; and
   implementing OPC on the IC design layout including the target region with the adjusted second pattern therein.

2. The computer-implemented method of claim 1, wherein the first pattern in the target region includes a projection of printing errors above a threshold value, wherein the projected printing error includes one of a spacing error, a width error, or a coverage error.

3. The computer-implemented method of claim 1, wherein the adjusting of the design of the second pattern includes adding a shape to the second pattern or removing a shape from the second pattern, and wherein the method further includes recalculating a printability metric of the first and second patterns after the adjusting.

4. The computer-implemented method of claim 3, further comprising, before implementing OPC on the IC design layout:
   determining whether the adjusting of the design of the second pattern increases the printability metric of the first pattern, based on the recalculating;
   storing the adjusted design of the second pattern in a memory of the computing device, and repeating the adjusting of the design of the second pattern with a different adjustment in response to the printability metric of the first pattern having decreased after the adjusting; and
   submitting the IC design layout for OPC implementation in response to the printability metric of the first pattern having increased after the adjusting.

5. The computer-implemented method of claim 3, wherein recalculating the printability metric of the first pattern includes generating a localized model of the target region to determine an effect of the adjusting on a total printability metric of the target region.

6. The computer-implemented method of claim 1, wherein the plurality of patterns in the target region further includes a third pattern positioned adjacent to the first and second patterns, wherein the third pattern lowers a printability metric of the first pattern, and wherein the OPC modeling rule of the IC design layout prohibits the first and third patterns from being adjusted.

7. The computer-implemented method of claim 1, further comprising adjusting a design of at least one other pattern in the target region of the IC design layout, after adjusting the second pattern.

8. A program product stored on a computer readable storage medium, the program product operative to adjust an integrated circuit (IC) layout for optical proximity correction (OPC) when executed, the computer readable storage medium comprising program code for:
    defining a target region of the IC design layout, the target region having a plurality of patterns including a first pattern positioned adjacent to a second pattern, wherein an OPC modeling rule of the IC design layout prohibits the first pattern from being adjusted, and wherein the second pattern does not reduce a printability metric of the first pattern;
    adjusting the design of the second pattern to reduce at least one printing error in the first pattern, wherein a functionality of the second pattern in the IC design layout is unchanged after the adjusting; and
    implementing OPC on the IC design layout including the target region with the adjusted second pattern therein.

9. The program product of claim 8, wherein the first pattern in the target region includes a projection of printing errors above a threshold value, wherein the projected printing error includes one of a spacing error, a width error, or a coverage error.

10. The program product of claim 8, wherein the program code for adjusting of the design of the second pattern further includes codes for adding a shape to the second pattern or removing a shape from the second pattern, and wherein the method further includes recalculating a printability metric of the first and second patterns after the adjusting.

11. The program product of claim 10, further comprising program code for:
    determining whether the adjusting of the design of the second pattern increases the printability metric of the first pattern, based on the recalculating;
    storing the adjusted design of the second pattern in a memory, and repeating the adjusting of the design of the second pattern with a different adjustment in response to the printability metric of the first pattern having decreased after the adjusting; and
    submitting the IC design layout for OPC implementation in response to the printability metric of the first pattern having increased after the adjusting.

12. The program product of claim 10, wherein recalculating the printability metric of the first and second patterns includes generating a localized model of the target region to determine an effect of the adjusting on a total printability metric of the target region.

13. The program product of claim 8, wherein the plurality of patterns in the target region further includes a third pattern positioned adjacent to the first and second patterns, wherein the third pattern lowers a printability metric of the first pattern, and wherein the OPC modeling rule of the IC design layout prohibits the first and third patterns from being adjusted.

14. The program product of claim 8, further comprising code for adjusting a design of at least one other pattern in the target region of the IC design layout, after adjusting the second pattern.

15. A system for adjusting an integrated circuit (IC) layout for optical proximity correction (OPC), the system comprising:
    a computing device configured to define a target region of the IC design layout, the target region having a plurality of patterns including:
        a first pattern positioned adjacent to a second pattern, wherein an OPC modeling rule of the IC design layout prohibits the first pattern from being adjusted, and wherein the second pattern does not reduce a printability metric of the first pattern; and
    an OPC modeling device for adjusting the design of the second pattern in an OPC model to reduce printing errors in the first pattern, wherein a functionality of the second pattern in the IC design layout is unchanged after the adjusting, and wherein the OPC model is used to manufacture at least one IC.

16. The system of claim 15, wherein the first pattern in the target region includes a projection of printing errors above a threshold value, wherein the projected printing error includes one of a spacing error, a width error, or a coverage error.

17. The system of claim 15, wherein the plurality of patterns in the target region further includes a third pattern positioned adjacent to the first and second patterns, wherein the third pattern lowers a printability metric of the first pattern, and wherein the OPC modeling rule of the IC design layout prohibits the first and third patterns from being adjusted.

18. The system of claim 15, wherein the OPC modeling device is further configured to generate a localized model of the target region to determine an effect of the adjusting on a total printability metric of the target region.

19. The system of claim 15, wherein the OPC modeling device is further configured to add a shape to the second pattern or remove a shape from the second pattern when adjusting the design of the second pattern, and wherein the OPC modeling device is further configured to recalculate a printability metric of the first and second patterns after the adjusting.

20. The system of claim 15, wherein the computing device is further configured to adjust a design of at least one other pattern in the target region of the IC design layout, after adjusting the second pattern.

* * * * *